US006650259B1

(12) United States Patent
Cooper (10) Patent No.: US 6,650,259 B1
(45) Date of Patent: Nov. 18, 2003

(54) CHARACTER TABLE IMPLEMENTED DATA DECOMPRESSION METHOD AND APPARATUS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/140,782

(22) Filed: May 6, 2002

(51) Int. Cl.[7] ............................................... H03M 7/30
(52) U.S. Cl. .............................. 341/87; 341/106; 341/51
(58) Field of Search ............................. 341/51, 87, 106

(56) References Cited

U.S. PATENT DOCUMENTS

| | | | | |
|---|---|---|---|---|
| 4,558,302 A | * | 12/1985 | Welch | 340/347 DD |
| 6,426,711 B1 | * | 7/2002 | Cooper | 341/87 |
| 6,466,144 B1 | * | 10/2002 | Cooper | 341/106 |
| 6,570,511 B1 | * | 5/2003 | Cooper | 341/59 |

* cited by examiner

Primary Examiner—Howard L. Williams
(74) Attorney, Agent, or Firm—Albert B. Cooper; Michael B. Atlass; Mark T. Starr (57) ABSTRACT

A data decompressor for decompressing an input stream of compressed codes to recover an output stream of data characters corresponding thereto. A plurality of character tables corresponding to respective characters store strings of data characters, the stored strings having respective string codes associated therewith. A string comprises a prefix string of at least one character followed by an extension character. A string is stored in the character tables by storing the code associated with the string prefix in the character table corresponding to the string extension character at a character table location corresponding to the string code of the string. The character tables are accessed with a currently received compressed code so as to recover a string corresponding thereto and the characters of the recovered string are output. An extended string is inserting into the character tables comprising the string corresponding to the compressed code received previously to the currently received compressed code extended by the first character of the recovered string, the extended string being stored in the character tables by storing the previously received compressed code in the character table corresponding to the first character of the recovered string at the character table location corresponding to the string code assigned to the extended string. A directory linking the string codes to respective character tables in which the strings corresponding to the string codes are stored is utilized in accessing a stored string.

16 Claims, 7 Drawing Sheets

CHARACTER PROCESSING
Figure 3

EXCEPTION CASE CHARACTER PROCESSING
Figure 5

Figure 4

Figure 6
EXCEPTION CASE STRING PROCESSING

INPUT COMPRESSED CODE STREAM
$a_1$ $b_1$ 258 260 $b_2$ $c_1$ 258 263 262 264 $d_1$

| ACTION | PREV CODE | CURR CODE | CODE CNTR | DIRECTORY STRING CODE | DIRECTORY CHAR TBLE | WRKG CODE | CHAR TBLE | INDEX (STRING CODE) | PREFIX CODE | STRING RECVRY BUFFER | OUTPUT | BLOCKS OF FIG. 2-6 |
|---|---|---|---|---|---|---|---|---|---|---|---|---|
| 1 | | $a_1$ | 258 | | | | | | | | $a_1$ | 60-65 |
| 2 | $a_1$ | $b_1$ | 259 | 258 | $b_1$ | | | 258 | $a_1$ | | $b_1$ | 70,71,74,90-93 |
| 3 | $b_1$ | 258 | | | | 258 | b | (258) | ($a_1$) | $b_1$ | | 80-83,70-72,75,100-104 |
| 4 | | | | | | $a_1$ | b | 258 | $b_1$ | $b_1a_1$ | $a_1b_1$ | 105-111 |
| 5 | 258 | 260 | 260 | 259 | $a_1$ | 258 | a | (258) | ($a_1$) | | | 80-83,70-73,77,130-135 |
| 6 | | | | | | $a_1$ | b | 259 | ($a_1$) | $a_1b_1a_1$ | $a_1b_1a_1$ | 136-142 |
| 7 | 260 | $b_2$ | 261 | 260 | $b_2$ | | | 260 | 258 | | $b_2$ | 80-83,70,71,74,90-93 |
| 8 | $b_2$ | $c_1$ | 262 | 261 | $c_1$ | | | 261 | 260 | | $c_1$ | 80-83,70,71,74,90-93 |
| 9 | $c_1$ | 258 | | | | 258 | b | 262 | $b_2$ | | | 80-83,70-72,75,100-104 |
| 10 | | | | | | $a_1$ | a | (258) | ($c_1$) | $b_1a_1$ | $a_1b_1$ | 105-111 |
| 11 | 258 | 263 | 263 | 262 | $c_1$ | 263 | a | 263 | $c_1$ | $a_1$ | | 80-83,70-72,75,100-104 |
| 12 | | | | | | $c_1$ | c | (263) | ($c_1$) | $a_1c_1$ | $c_1a_1$ | 105-111 |
| 13 | 263 | 262 | 264 | 263 | | 262 | c | 264 | 258 | $c_1b_2$ | $b_2c_1$ | 80-83,70-72,75,100-104 |
| 14 | | | | | | $b_2$ | b | (262) | ($b_2$) | $c_1$ | | 105-111 |
| 15 | 262 | 264 | 265 | 264 | | 264 | c | 265 | 263 | $c_1$ | | 80-83,70-72,75,100-104 |
| 16 | | | | | | 258 | b | (264) | (258) | $c_1b_1$ | | 105,106,102-104 |
| 17 | | | | | | $a_1$ | a | (258) | ($a_1$) | $c_1b_1$ | | 105-111 |
| 18 | 264 | $d_1$ | 266 | 266 | $a_1$ | | | 266 | 262 | $c_1b_1a_1$ | $a_1b_1c_1$ | 80-83,70,71,74,90-93 |
| 19 | $d_1$ | ... | 267 268 | 267 | $d_1$ | | | 267 | 264 | | $d_1$ | 80-83,70,END |

CHARACTER TABLE IMPLEMENTED DATA DECOMPRESSION METHOD AND APPARATUS

CROSS REFERENCE TO RELATED APPLICATIONS

U.S. Pat. No. 6,426,711 "Character Table Implemented Data Compression Method And Apparatus" by Cooper, filed May 14, 2001, discloses a character table implementation for LZ dictionary type compressors.

U.S. Pat. No. 6,400,286 "Data Compression Method And Apparatus Implemented With Limited Length Character Tables" by Cooper, filed Jun. 20, 2001, discloses a data compression system similar to that of said U.S. Pat No. 6,426,711 with the additional capability of selectively limiting the lengths of the character tables to provide selective string storage.

U.S. Pat. No. 6,570,511 "Data Compression Method And Apparatus Implemented With Limited Length Character Tables And Compact String Code Utilization" by Cooper, filed Oct. 15, 2001, discloses a data compression system similar to that of said U.S. Pat. No. 6,400,286 with the additional capability of utilizing all of the assignable string codes to represent stored strings so as to favorably affect compression efficiency.

U.S. Pat. No. 6,466,144 "Data Decompressor For Use With A Data Compressor Implemented With Limited Length Character Tables And Compact String Codes" by Cooper, filed Nov. 30, 2001, discloses a data decompression system suitable to recover the data character stream corresponding to the compressed code output from a compressor of the type described in said U.S. Pat. No. 6,570,511.

U.S. patent application Ser. No. 10/101,046 "Prefix Table Implemented Data Compression Method And Apparatus" by Cooper, filed Mar. 19, 2002, discloses a prefix table implementation for LZ dictionary type compressors.

Said U.S. Pat. Nos. 6,426,711; 6,400,286 6,570,511; 6,466,144 and Ser. No. 10/101,046 are incorporated herein by reference.

BACKGROUND OF THE INVENTION

1. Field of the Invention

The invention relates to LZ data compression and decompression systems particularly with respect to the LZW compression and decompression methodologies. More particularly, the invention relates to a decompressor utilizing an architecture similar to the character table architecture of the data compressor disclosed in said U.S. Pat. No. 6,426,711.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described In the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression and decompression systems, data character strings are stored and accessed in the compressor and decompressor dictionaries utilizing well known searchtree architectures and protocols. The compressor of said U.S. Pat. No. 6,426,711 utilizes a new string storage and access architecture involving character tables which, it is believed, improves the performance of LZ type data compression algorithms.

In numerous environments, a data compressor and decompressor are utilized at the same location. For example, in a disk or tape storage system, the data entering the system for storage may be compressed at the input and the compressed stored data may be decompressed at the output to recover the original information. In such systems, it may be desirable to utilize the same architecture for the compressor and decompressor so that the same compressor/decompressor resources may be shared thereby.

It is believed that a decompressor implemented with the character table architecture of the compressor of said U.S. Pat. No. 6,426,711 is not available in the prior art. It is, therefore, an objective of the present invention to provide such a decompressor.

SUMMARY OF THE INVENTION

The objective of the present invention is achieved by a decompressor that recovers and outputs a stream of data characters corresponding to an input stream of compressed codes, the data characters being from an alphabet of data characters. The decompressor includes a plurality of character tables, corresponding to respective characters of the alphabet, storing strings of data characters, the stored strings having respective string codes associated therewith. A string comprises a prefix string of at least one of the characters followed by an extension character. A particular string is stored in the character tables by storing the code associated with the prefix string of the particular string in the character table corresponding to the extension character of the particular string at a character table location corresponding to the string code of the particular string. The character tables are accessed with a currently received compressed code so as to recover a string corresponding thereto from the character tables, thereby providing a recovered string. The characters of the recovered string are output, thereby providing the output stream of data characters. An extended string is inserted into the character tables comprising the string corresponding to the compressed code received previously to the currently received compressed code extended by the first character of the recovered string. The extended string is stored in the character tables by storing the previously received compressed code in the character table corresponding to the first character of the recovered string at the character table location corresponding to the string code assigned to the extended string.

DESCRIPTION OF THE PREFERRED EMBODIMENTS

The best mode embodiments described below, utilizing the Character Table implementation architecture of the present invention, are predicated, generally, on the LZW methodology. The embodiments utilize an implementation feature similar to that described above where the single character strings are considered as recognized by the decompressor although not explicitly initialized therein.

Figure 1:
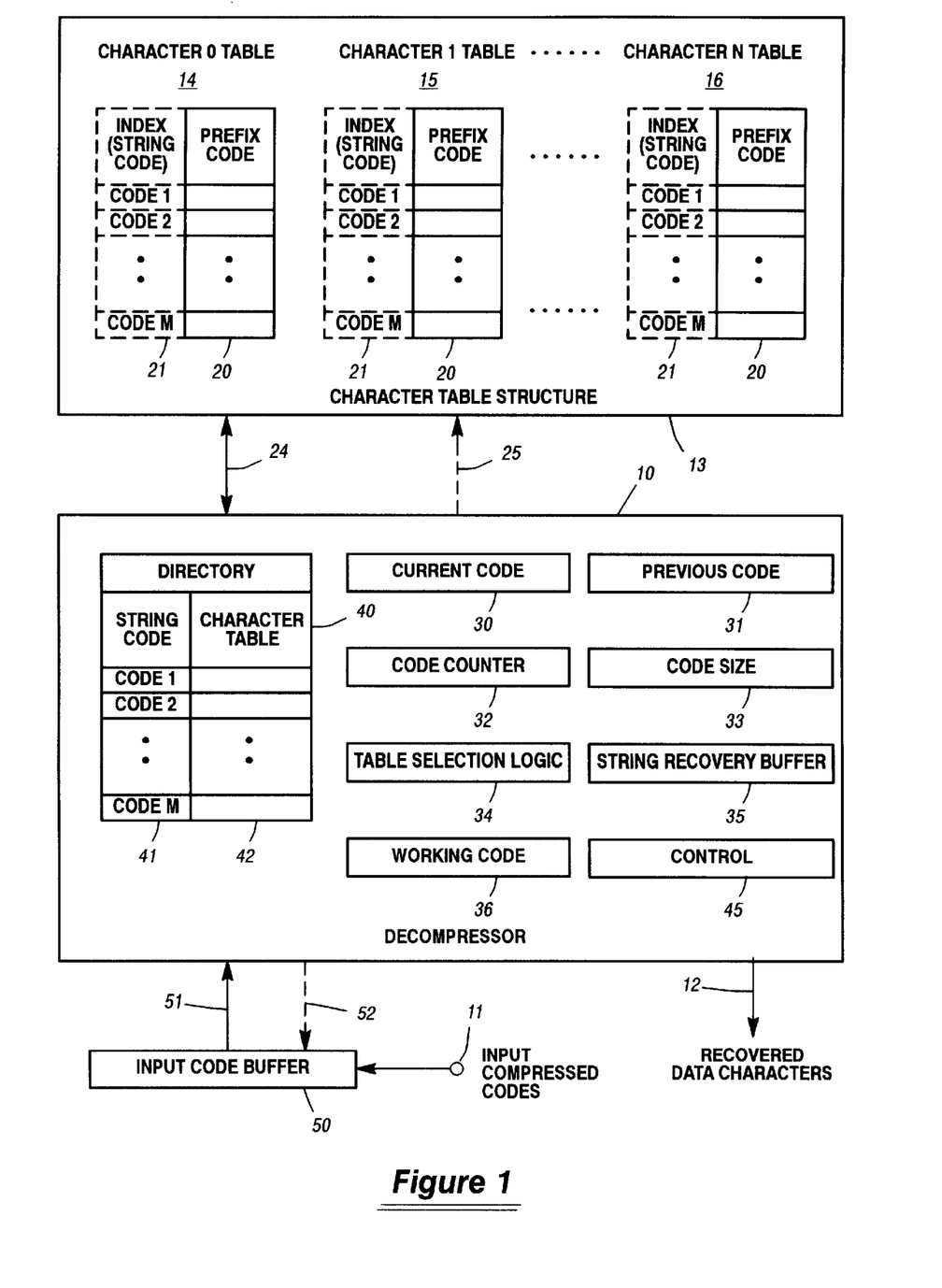
FIG. 1 a schematic block diagram of a data decompressor for decompressing a stream of compressed codes in accordance with the present invention.

Referring to FIG. 1, a data decompressor 10 is illustrated that decompresses a stream of compressed codes applied at an input 11 into a recovered stream of data characters at an output 12, the data characters being from an alphabet of data characters.

Included, in accordance with the invention, is Character Table Structure 13 for storing strings of data characters. A data character string is comprised of a prefix string of one or more characters followed by an extension character. The Character Table Structure 13 is comprised of Character Tables 14–16 corresponding to the respective data characters of the alphabet. Each of the Character Tables 14–16 is comprised of a plurality of Table locations 20 for storing respective prefix codes of the prefix strings of strings stored in the Character Table Structure 13. The Table locations 20 of the Character Tables 14–16 are accessed by respective Indices 21.

A string is stored in the Character Table Structure 13 by storing the prefix code of the prefix of the string in the Character Table 14–16 corresponding to the extension character of the string at a Character Table location 20 corresponding to the string code of the string. The string code is utilized as the Index 21. Data is communicated between the decompressor 10 and the Character Table Structure 13 by a bi-directional data bus 24 under control of a control bus 25.

In typical LZW data compressors, the maximum assignable string code is 4095 and in the ASCII environment, for example, the 256 characters of the alphabet have values of 0–255. When these limitations are applied to the present embodiments, the multiple character string code Indices 21 may range from 258 through 4095 where the codes 256 and 257 are utilized as control codes. The prefix codes 20 will, therefore, range from 0 through 255 and 258 through 4094. Prefix codes having character values represent the storage of two-character strings.

It will be appreciated that since string codes are uniquely assigned to respective strings, a particular string will be stored uniquely in a particular character table with the string code of the string uniquely providing a string code Index 21 into that Character Table.

The decompressor 10 includes a Current Code register 30, a Previous Code register 31, a Code Counter 32 and a Code Size register 33. The Code Counter 32 sequentially generates code values to be assigned to extended strings stored in the Character Table Structure 13 by the decompressor 10 and are used to process incoming compressed codes in a manner to be described. The Code Size register 33 is utilized, as is well known, to control the number of bits in which the decompressor 10 receives input compressed codes.

The decompressor 10 further includes table selection logic 34 for selecting the appropriate Character Table 14–16 in a manner to be explained. Also included is a String Recovery Buffer 35 for holding the characters of recovered strings stored in the Character Table Structure 13 that are accessed by compressed codes. The data characters of the string in the Buffer 35 are provided to the decompressor output 12 in the appropriate order. The data characters of strings are recovered, in a manner to be described, from the Character Table Structure 13 in reverse order. The String Recovery Buffer 35 is utilized to provide the characters in the correct order. Further included is Working Code register 36 utilized in recovering strings from the Character Table Structure 13 in a manner to be described.

The decompressor 10 further includes a Directory 40 utilized to navigate through the Character Tables 14–16. The Directory 40 is comprised of string code Indices 41 into Directory locations 42 storing respective characters corresponding to the Character Tables in which the respective string codes are stored. The decompressor 10 includes control 45 for controlling the operations of the decompressor 10 in accordance with the operational flow charts of FIGS. 2–6 to be described below.

Further included is an Input Code Buffer 50 that buffers the input compressed codes received at the input 11. The individual input codes are applied from the Input Code Buffer 50, via a bus 51, to the Current Code register 30 in accordance with operations to be described. The decompressor 10 controls acquiring codes from the Input Code Buffer 50 via a control bus 52.

Briefly, the operation of the decompressor 10 is as follows. The decompressor 10 is initialized by setting the Code Counter 32 to the first available multiple string code and by setting the Code Size register 33 to the initial code size. Additionally, the Directory 40, the Character Tables 14–16 and the Current Code register 30 are cleared.

Compressed codes are fetched to the Current Code register 30 utilizing the number of bits determined by the code size in the Code Size register 33. A fetched code is examined to determine if it is equal to a character value, corresponds to a multiple character string stored in the Character Table Structure 13 or corresponds to a multiple character string that is not yet stored in the Character Table Structure 13. The Directory 40 is utilized for this purpose by determining if a Character Table is listed that is storing the currently fetched multiple character string code.

If the fetched code is equal to a character value, the character is output and an update extended string is stored in the Character Table corresponding to Current Code. The Directory 40 is updated to reflect the linkage between the string code assigned to the update string and the Character Table in which it is stored.

If the fetched code is a multiple character string code and a Character Table is listed in the Directory 40 that is storing the fetched current code, Current Code is utilized to access the listed Character Table to retrieve the prefix code stored at the accessed location. The retrieved prefix code is utilized to index the Directory 40 to determine the next Character Table to select in order to retrieve a next prefix code. In this manner the Directory 40 is utilized to navigate through the Character Tables until the retrieved prefix code is a character value. The characters represented by the selected Character Tables are transferred to the String Recovery Buffer 35. When the string recovery procedure is completed the characters are provided at the output 12 in the appropriate order.

An update string is stored in the Character Table corresponding to the first character of the recovered string and the Directory 40 is updated to reflect the linkage between the string code assigned to the update string and the Character Table in which it is stored.

If the currently fetched code is a multiple character string code but does not have a corresponding Character Table listed in the Directory 40, exception case processing is invoked. In exception case processing, the Character Tables are sequentially accessed utilizing the Directory 40 to construct a string corresponding to Current Code. The string construction is performed, in a manner to be described, utilizing the string corresponding to Previous Code. An update string is stored in the Character Table corresponding to the first character of the constructed string. The Directory 40 is updated to reflect the linkage between the string code assigned to the update string and the Character Table in which it is stored.

Figure 2:
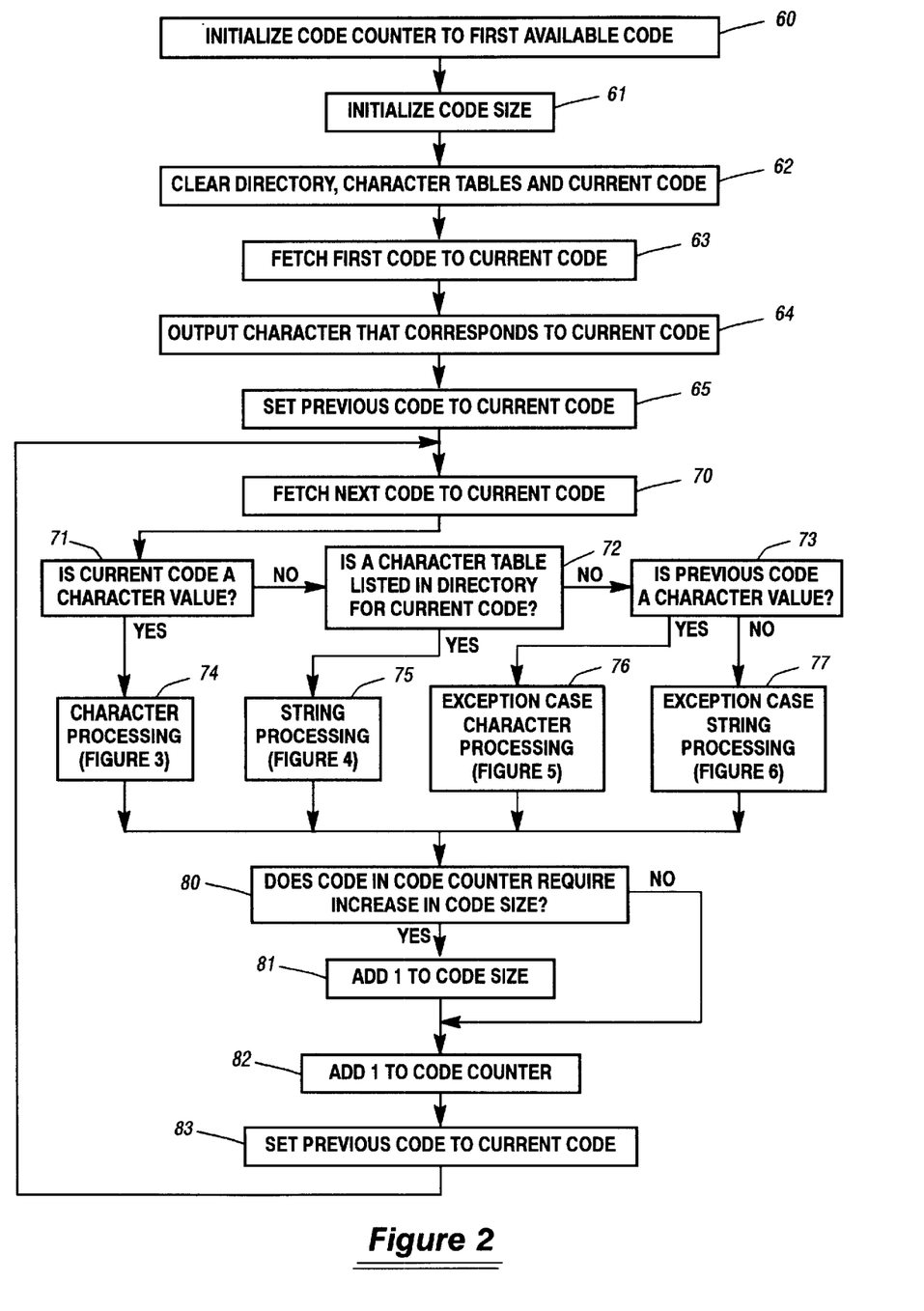
FIG. 2 is a control flow chart illustrating the operations executed by the decompressor of FIG. 1 so as to perform data decompression in accordance with the present invention.

Referring to FIG. 2, with continued reference to FIG. 1, a control flow chart is illustrated showing the detailed operations to be executed by the decompressor 10. The control 45 of the decompressor 10 is considered as containing appropriate circuitry, such as state machines, or appropriate software, to control execution of the operations. The control flow chart of FIG. 2 is predicated on a variable length code and the Code Size register 33 is utilized to this effect. In an ASCII variable length code implementation, the code size may begin with 9 bits and sequentially increase to 10, 11 and 12 bits at codes 512, 1024 and 2048, respectively. It is appreciated that a fixed code size may also be utilized with appropriate modifications to the embodiment.

Control enters a block 60 whereat the Code Counter 32 is initialized to a first available code, for example, 258 in the ASCII environment. At a block 61, the Code Size register 33 is initialized to the beginning code size, for example, 9 bits in the ASCII environment. At a block 62, the Directory 40, the Character Tables 14–16 and the Current Code register 30 are cleared.

Processing proceeds to a block 63 whereat the first input compressed code is fetched to the Current Code register 30 utilizing the number of bits determined by code size. Because of the operations of LZW compressors compatible with the decompressor of the present invention, the first fetched code represents a single character string. Accordingly, at a block 64, the character corresponding to Current Code is provided at the decompressor output 12. At a block 65, the code in the Current Code register 30 is transferred to the Previous Code register 31.

At a block 70, the next input compressed code is fetched to the Current Code register 30. It is appreciated that the code fetched to the Current Code register 30 may represent either a single character string or a multiple character string. As is well known, such strings are distinguished from one another by the value of the code. Generally, multiple character strings are represented by codes that are greater than or equal to the first available code discussed above with respect to the block 60. Codes for single character strings generally have values equal to, or representative of, the single character and therefore have values less than the first available code. In an ASCII environment a code representing a single character has a value less than 256 while a code representing a multiple character string has a value that is not less than 256.

Accordingly, at a block 71, the code in the Current Code register 30 is tested to determine if Current Code represents a character value. Conveniently, the test of the block 71 may be to determine if Current Code is less than a predetermined value greater than the character values. If so, the YES branch is taken from the block 71 to a block 74 whereat character processing is performed. Details of the character processing block 74 will be discussed with respect to FIG. 3.

If, at the block 71, Current Code does not represent a character value, the NO branch from the block 71 is taken to a block 72. At the block 72, the Directory 40 is accessed to determine if a Character table is listed therein for Current Code. The test is performed to determine if the string corresponding to Current Code is in the Character Table Structure 13. Alternatively, Current Code in the Current Code register 30 may be compared to the code in the Code Counter 32. The string corresponding to Current Code will be in the Character Table Structure 13 if Current Code is less than Code Counter.

If the string corresponding to Current Code is in the Character Table Structure 13, the YES branch from the block 72 is taken to a block 75 whereat string processing is performed. Details of the string processing of the block 75 will be discussed with respect to FIG. 4.

If, at the block 72, a Character Table is not listed in the Directory 40 for Current Code, signifying that the string corresponding to Current Code is not yet in the Character Table Structure 13, exception case processing is invoked. It is appreciated that exception case processing will be invoked in the embodiment described herein when the received compressed code in the Current Code register 30 is equal to the code in the Code Counter 32.

When exception case processing is invoked, the NO branch is taken from the block 72 to a block 73 whereat the Previous Code register 31 is tested to determine if a character value is stored therein. If Previous Code is a character value, the YES branch is taken from the block 73 to a block 76. At the block 76, exception case character processing is performed as will be described in detail with respect to FIG. 5. If Previous Code is not a character value, but instead represents a multiple character string, the NO branch is taken from the block 73 to a block 77. At the block 77, exception case string processing is performed as will be described in detail with respect to FIG. 6.

The processing performed at the blocks 76 and 77 is predicated on the exception case LZW data decompression processing of, for example, said U.S. Pat. 4,558,302.

Processing proceeds from the blocks 74–77 to a block 80 whereat the code in the Code Counter 32 is tested to determine if an increase in code size is required. If so, processing continues to a block 81 whereat the Code Size register 33 is incremented by 1. If an increase in code size is not required at the block 80, the block 81 is bypassed to continue processing at a block 82. At the block 82, the Code Counter 32 is incremented by 1. Control continues with a block 83 whereat the Current Code in the Current Code register 30 is transferred to the Previous Code register 31. Processing then loops back to the block 70 to fetch the next input compressed code.

Figure 3:
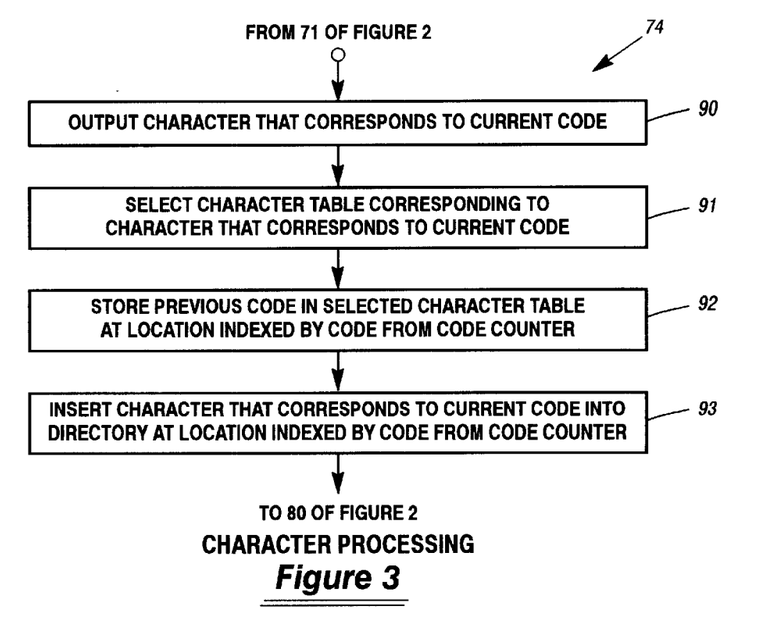
FIGS. 3, 4, 5 and 6 are control flow charts illustrating details of the character processing, string processing, exception case character processing and exception case string processing of FIG. 2, respectively.

Referring to FIG. 3, with continued reference to FIGS. 1 and 2, details of the character processing of the block 74 of FIG. 2 are illustrated. It is appreciated that the character processing of FIG. 3 is invoked when the decompressor 10 receives an input compressed code that represents a single character string. Accordingly, processing enters a block 90 from the block 71 of FIG. 2 whereat the character corresponding to the code in the Current Code register 30 is provided by the decompressor 10 at the output 12.

At blocks 91 and 92 an appropriate update extended string is stored in the Character Table Structure 13 and assigned the next available string code from the Code Counter 32. Specifically, at block 91, the Character Table corresponding to the character in the Current Code register 30 is selected. The table selection logic 34 is utilized to perform this function. At the block 92, Previous Code from the Previous Code register 31 is stored in the Character Table selected at the block 91 at the Character Table location indexed by the code from the Code Counter 32.

Processing proceeds to a block 93 whereat the Directory 40 is updated with the linkage between the selected Character Table and the string code indexed therein at the block 92. Accordingly, at the block 93, the character that corresponds to Current Code from the Current Code register 30 is inserted into the Character Table field 42 of the Directory 40 at the location indexed by the code from the Code Counter 32 utilizing string code index 41.

Figure 4:
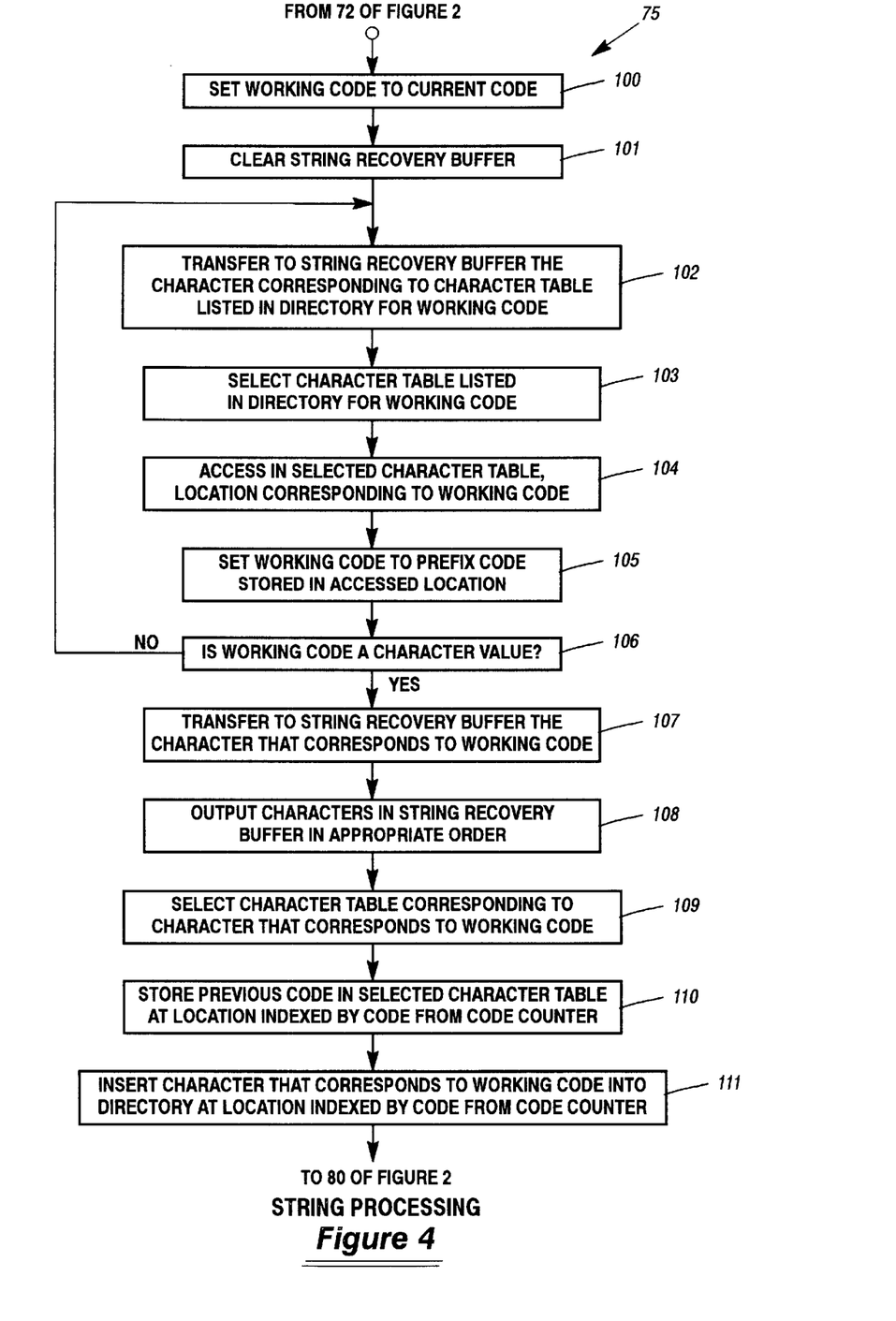

Referring to FIG. 4, with continued reference to FIGS. 1 and 2, details of the string processing of the block 75 of FIG. 2 are illustrated. It is appreciated that the string processing of FIG. 4 is invoked when the decompressor 10 receives an input compressed code that represents a multiple character string that is stored in the Character Table Structure 13. Accordingly, processing enters a block 100 from the YES branch of the block 72 of FIG. 2 when a Character Table is listed in the Directory 40 for the input string code in the Current Code register 30.

At the blocks 100–107, the characters of the string are recovered, utilizing the Working Code register 36, and assembled in the String Recovery Buffer 35. At the block 100, the Working Code register 36 is set to the code in the Current Code register 30 and at the block 101 the String Recovery Buffer 35 is cleared. The blocks 102–106 form a loop for recovering the characters of the string.

Thus, at the block 102, the character corresponding to the Character Table listed in the Directory 40 for Working Code is transferred to the String Recovery Buffer 35 and at the block 103 this Character Table is selected. At the block 104, the location corresponding to Working Code in the selected Character Table is accessed and, at the block 105, the Working Code register 36 is set to the prefix code stored in the accessed location. At the block 106, a test is performed to determine if the Working Code register 36 is storing a character value. If Working Code is not a character value, the NO branch from the block 106 is taken back to the block 102 to recover further characters of the string.

When Working Code becomes a character value, the YES branch from the block 106 is taken to a block 107 whereat the character that corresponds to Working Code is transferred to the String Recovery Buffer 35.

At the block 107, all of the characters of the string corresponding to Current Code have been recovered and transferred to the String Recovery Buffer. It is appreciated, however, that the characters of the string in the String Recovery Buffer are in reverse order. At the block 108, the characters of the string are provided from the String Recovery Buffer 35 to the decompressor output 12 in the appropriate order.

Processing proceeds to blocks 109 and 110 whereat the appropriate update extended string is stored in the Character Table Structure 13 utilizing the string code assigned by the Code Counter 32. Accordingly, at the block 109, the Character Table corresponding to the character in the Working Code register 36 is selected and, at the block 110, Previous Code from the Previous Code register 31 is stored in the selected Character Table at the location indexed by the code from the Code Counter 32.

At a block 111, the Directory 40 is updated with the linkage between the string code assigned to the stored extended string and the Character Table in which the string is stored. Accordingly, the character in the Working Code register 36 is inserted into the Character Table field 42 of the Directory 40 at the location indexed by the code from the Code Counter 32.

Figure 5:
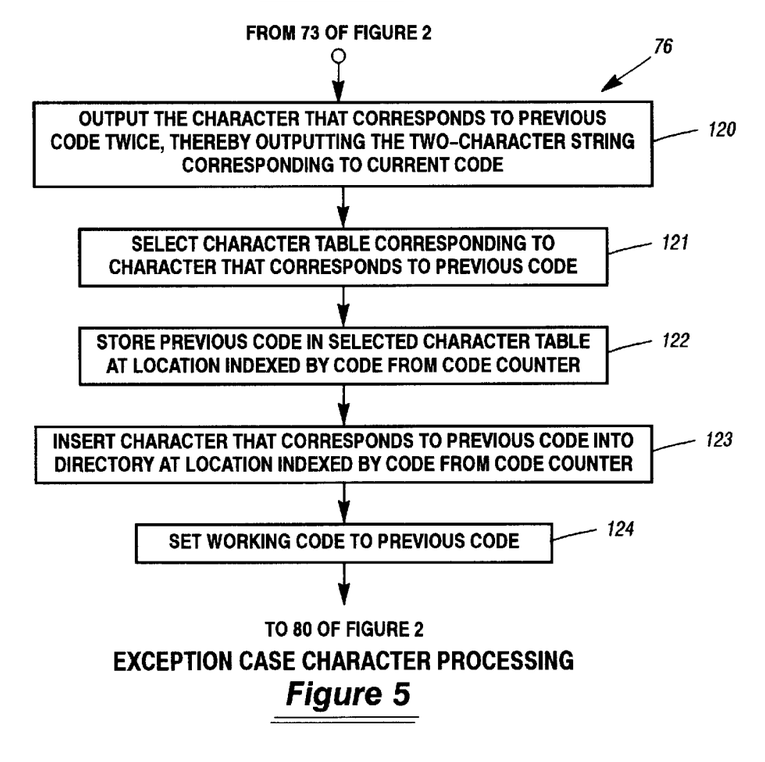

Referring to FIG. 5, with continued reference to FIGS. 1 and 2, details of the exception case character processing block 76 of FIG. 2 are illustrated. As discussed above with respect to FIG. 2, exception case processing is performed with respect to the blocks 73, 76 and 77 when the string corresponding to Current Code is not yet stored in the Character Table Structure 13. The string corresponding to Current Code is constructed from the string corresponding to Previous Code by extending the previous code string by the first character thereof. The processing of FIG. 5 constructs the exception case string when Previous Code is a character value.

Accordingly, processing enters a block 120 from the YES branch of the block 73 of FIG. 2 when Previous Code is a character value. At the block 120, the character that corresponds to Previous Code is output twice, thereby outputting the two-character string corresponding to Current Code. Specifically, the character value in the Previous Code register 31 is applied twice to the decompressor output 12 to thereby output the string.

At blocks 121–123, the update extended string is stored in the Character Table Structure 13 and the Directory 40 is updated to provide the linkage between the stored string and the Character Table in which it is stored. Specifically, at the block 121, the Character Table corresponding to the character that corresponds to Previous Code is selected. The character value in the Previous Code register 31 is utilized in performing this function. At the block 122, Previous Code from the Previous Code register 31 is stored in the selected Character Table at the location indexed by the code from the Code Counter 32. At the block 123, the character value from the Previous Code register 31 is inserted into the Directory 40 at the location indexed by the code from the Code Counter.

It is appreciated that the string created and stored at the blocks 120–123 is the string corresponding to Current Code.

Figure 6:
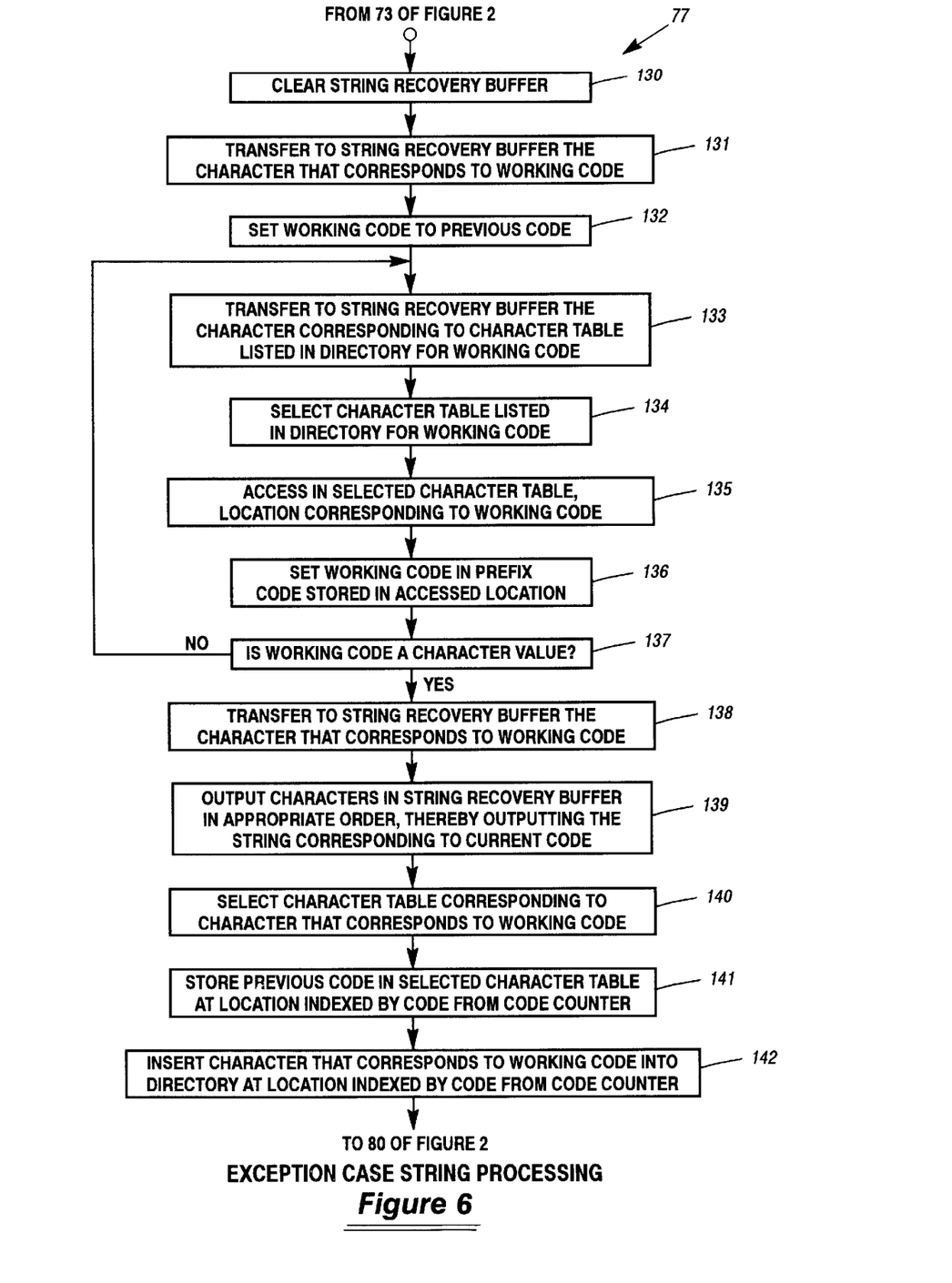

At a block 124, the Working Code register 36 is set to the character value in the Previous Code register 31 to provide an appropriate character value if the next decompression cycle should require the exception case string processing of FIG. 6.

Referring to FIG. 6, with continued reference to FIGS. 1–5, details of the exception case string processing of block 77 of FIG. 2 are illustrated. The processing of FIG. 6 creates and stores the string corresponding to Current Code by extending the multiple character string corresponding to Previous Code by the first character thereof.

Accordingly, processing enters a block 130 from the NO branch of the block 73 of FIG. 2 when Previous Code is not a character value. At the block 130, the String Recovery Buffer 35 is cleared and at a block 131, the character in the Working Code register 36 is transferred to the String Recovery Buffer 35. It is appreciated from blocks 105 and 106 of FIG. 4 and block 124 of FIG. 5, that when processing enters the block 131 of FIG. 6, the Working Code register 36 is storing the first character of the string corresponding to Previous Code. At the block 131, therefore, this character is transferred to the String Recovery Buffer 35 to become the last character of the string corresponding to Current Code that is being constructed.

At blocks 132–138, the characters of the string corresponding to Previous Code are sequentially acquired and transferred to the String Recovery Buffer 35.

Accordingly, at the block 132, Previous Code from the Previous Code register 31 is set into the Working Code register 36. The processing of blocks 133–138 is the same with respect to Previous Code as is the above described processing of the blocks 102–107 of FIG. 4 with respect to Current Code.

The blocks 139–142 output the characters of the constructed string, update the Character Table Structure 13 with the appropriate update extended string and update the linkage of the Directory 40. The processing of the blocks 139–142 is the same as that described above with respect to the blocks 108–111 of FIG. 4. It is appreciated that the constructed string that is output and stored is the string corresponding to Current Code.

Figure 7:
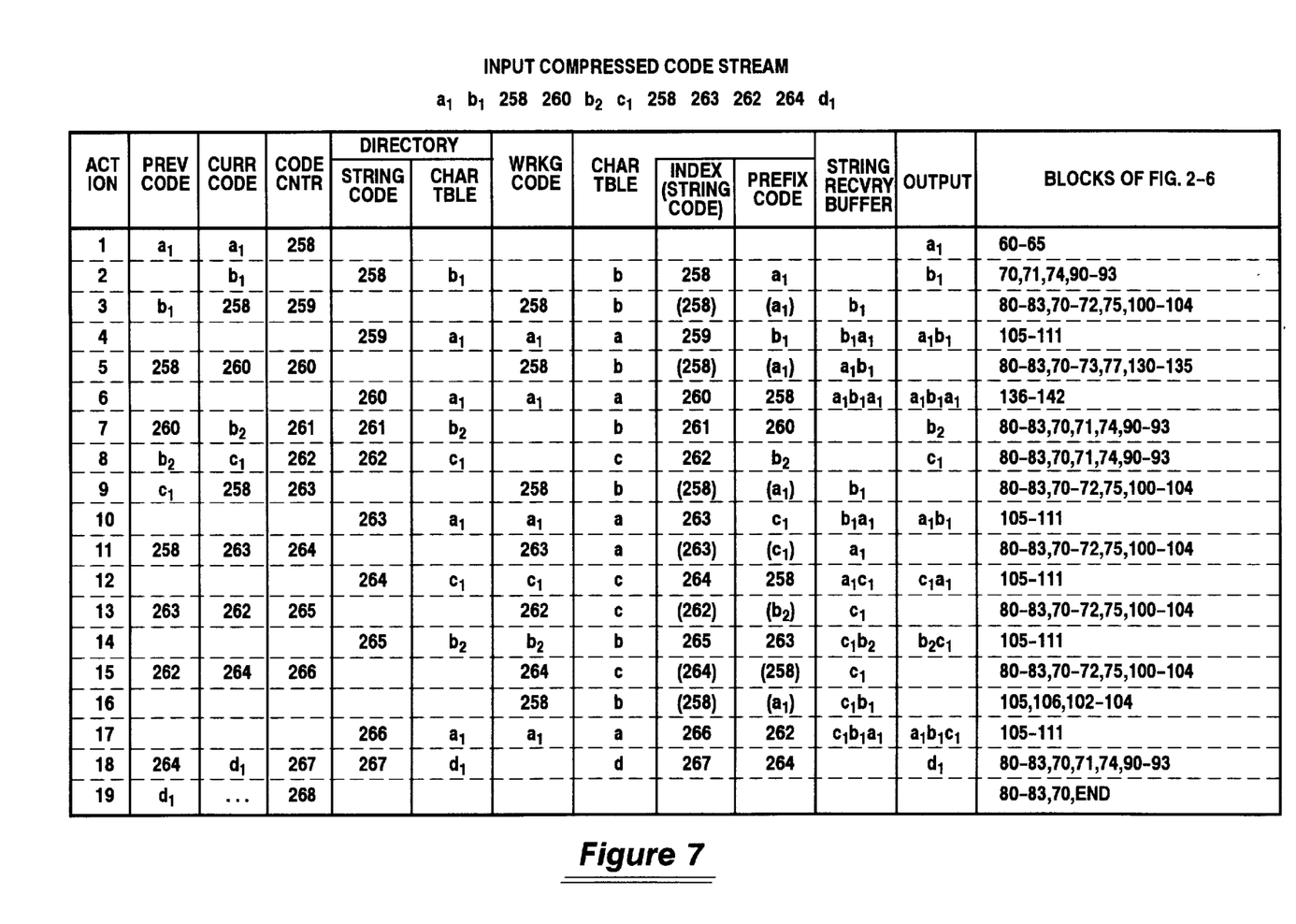
FIG. 7 is a chart exemplifying the operations of the decompressor of FIG. 1 in accordance with the control flow charts of FIGS. 2–6.

Referring to FIG. 7, with continued reference to FIGS. 1–6, an example of the operation of the decompressor 10 in accordance with the flow charts of FIGS. 2–6 is illustrated. At the top of FIG. 7, an input compressed code stream is shown where sequential codes are identified by sequence subscripts. This is done to facilitate following the progress of the codes through the steps of the example. It is appreciated that the sequence subscripts are shown for purposes of code identification and do not appear in the actual compressed code stream.

The example is largely self-explanatory, with the actions performed delineated in the left-hand column and the blocks of FIGS. 2–6 that participate in the actions designated in the right-hand column. The input compressed code stream is the compressed code stream provided at the output of the compressor of said Ser. No. 09/855,127 in the example of FIG. 3 thereof. The data character stream in the output column of FIG. 7 hereof is the input data character stream of the compressor of said Ser. No. 09/855,127 of the example of FIG. 3 thereof. It is appreciated, therefore, that the decompressor 10 of the present application has recovered the original data character stream of the example of FIG. 3 of said Ser. No. 09/855,127.

The Directory 40, as indicated in the Directory column, denotes the string codes and the Character Tables uniquely linked thereto. The Character Tables are indicated in the Character Table column, with the string code Indices and corresponding stored prefix codes illustrated in the respective columns. When a Character Table location is accessed for retrieving a prefix code, the string code index and prefix code stored at the location are indicated by parentheses. When a Character Table is accessed for inserting an update extended string, the string code index and inserted prefix code are illustrated without parentheses.

In action 1, the Code Counter is set to the first available code of 258 at the block 60 of FIG. 2. In action 2, the character processing of FIG. 3 is invoked by the Current Code of "b". As a result, the character "b" is output and the update extended string of "ab" is stored in the "b" Character Table indexed by the string code 258 from the Code Counter. The string is inserted into the Character Table by storing, in the indexed location, the prefix "a" from the Previous Code register. The Directory is updated to provide the linkage between the string code 258 and the "b" Character Table in which the string "ab" corresponding to code 258 is stored.

In actions 3 and 4, this string is recovered and output by the string processing logic of FIG. 4 in response to the Current Code of 258. Utilizing the linkage in the Directory, the "b" Character Table is accessed to retrieve the string prefix of "a". In action 4, the string is output, the "a" Character Table is updated with the string "ba" indexed by string code 259 and the Directory is updated with the linkage between the string code 259 and the "a" Character Table.

In actions 5 and 6, the exception case string processing of FIG. 6 is invoked to create, output and store the string "aba" and to update the Directory with the linkage between the string code 260 and the "a" Character Table. In action 18, the last Current Code of "d" invokes the character processing logic of FIG. 3 which outputs the corresponding character "d". In action 19, control enters the block 70 of FIG. 2 at which the end of processing occurs.

More detailed descriptions of the actions of FIG. 7 relative to the blocks of FIGS. 2–6 are readily apparent and will not be provided for brevity.

Figure 8:
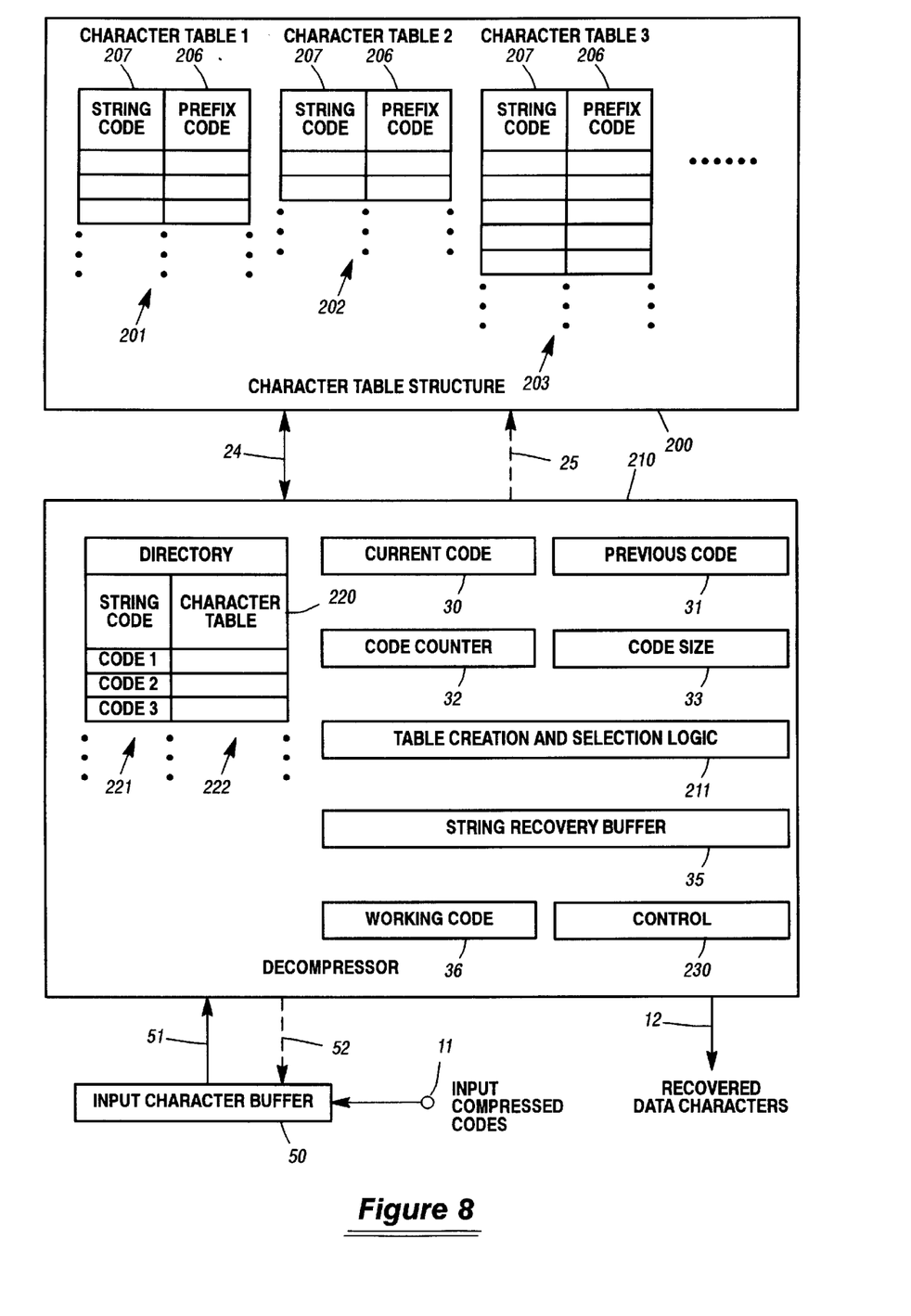
FIG. 8 is a schematic block diagram of an alternative embodiment of a data decompressor for decompressing data in accordance with the present invention. In the embodiment of FIG. 8, the Character Tables and the locations thereof are established when required.

Referring to FIG. 8, in which like reference numerals indicate like components with respect to FIG. 1 and with continued reference to FIGS. 1–6, an alternative embodiment of the data decompressor of the present invention is illustrated. Although the embodiment of FIG. 8 is configured and operates in a manner similar to that described above with respect to FIGS. 1–6, the FIG. 8 embodiment includes additional features that provide further enhancements.

The embodiment of FIGS. 1–6 utilizes pre-established Character Tables as described. In the FIG. 8 embodiment, Character Tables and Character Table locations are established when first required for storing extended strings. A location in an already established Character Table is created when the location is required in which to store the extended string. This may occur, for example, at blocks 91 and 92 of FIG. 3 and at blocks 109 and 110 of FIG. 4. By utilizing these additional features, only Character Table memory actually utilized by the operation of the decompressor is required.

Accordingly, the FIG. 8 embodiment includes Character Table Structure 200 illustrating Character Tables 201–203. In order to facilitate implementation of the additional features of the FIG. 8 embodiment, a Character Table 201–203 includes a location 206 in which to store the code of the prefix of a string and a corresponding location in which to store the string code of the string. In each Character Table, therefore, the stored string codes provide a String Code List 207 with which to index and access the corresponding prefix codes 206. By the operations of the embodiment, the stored string codes form a sequentially ordered list of string codes which facilitates performance.

The embodiment of FIG. 8 includes decompressor 210 comprising the previously described Current Code register 30, Previous Code register 31, Code Counter 32, Code Size register 33, String Recovery Buffer 35 and Working Code register 36. In addition, the decompressor 210 includes table creation and selection logic 211 for the "on-the-fly" creation of the Character Table Structure 200. The logic 211 selects appropriate Character Tables in the manner described above with respect to the logic 34 of FIG. 1 and, in addition, creates the Tables and Table locations as required.

The decompressor 210 further includes a Directory 220 utilized to navigate through the Character Tables 201–203 generally in the manner described above with respect to the Directory 40 of FIG. 1. Accordingly, the Directory 220 is comprised of string code fields 221 and corresponding Directory locations 222 for storing respective characters corresponding to the Character Tables in which the respective string codes are stored. The Directory 220 is dynamically updated creating the Directory locations as required. The string codes form a sequentially ordered String Code List 221 for indexing the respective Character Table indications.

The decompressor 210 includes control 230 for controlling the operations of the decompressor 210 generally in the manner described above with respect to the operational flow charts of FIGS. 2–6 except that, in the FIG. 8 embodiment, the Character Tables and Directory are dynamically created. For example, in FIG. 3, a test is performed prior to block 91 to determine if the required Character Table has already been established. If not, the appropriate Character Table is established and the functions of blocks 91 and 92 are performed. In block 93 of FIG. 3, the Directory location is established to store the required information and in blocks 109–111 of FIG. 4, appropriate Character Table and Directory locations are established as required.

The Input Code Buffer 50 performs the functions as described above. It is appreciated that the operational example of FIG. 7 is also applicable to the FIG. 8 embodiment.

The above embodiments are described in terms of utilizing the Directories 40 and 220 to navigate through the Character Tables. A further embodiment may be configured that does not include a Directory and where the Directory information is included within the Character Tables. Accordingly, the Character Tables may include a further field at each location for indicating the Character Table at which the prefix code is stored as a string code. This embodiment eliminates the use of a directory to determine the next Character Table to visit in recovering the characters of a stored string.

Although the above described embodiments of the invention are LZW based, it is appreciated that the present invention can be utilized with other known dictionary based decompression methodologies. It is further appreciated that the above described embodiments of the invention may be implemented in hardware, firmware, software or a combination thereof. Discrete circuit components may readily be implemented for performing the various described functions. In a software embodiment, appropriate modules programmed with coding readily generated from the above descriptions may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data decompression method for decompressing an input stream of compressed codes to recover an output stream of data characters corresponding thereto, said data characters being from an alphabet of data characters, comprising providing a plurality of character tables corresponding to respective characters of said alphabet, storing, in said character tables, strings of data characters, said stored strings having respective string codes associated therewith, a string comprising a prefix string of at least one of said characters followed by an extension character, a particular string being stored in said character tables by storing the code associated with the prefix string of said particular string in the character table corresponding to the extension character of said particular string at a character table location corresponding to the string code of said particular string, accessing said character tables with a currently received compressed code so as to recover a string corresponding to said currently received compressed code from said character tables, thereby providing a recovered string, outputting the characters of said recovered string, thereby providing said output stream of data characters, and inserting into said character tables, an extended string comprising the string corresponding to the compressed code received previously to said currently received compressed code extended by the first character of said recovered string, said extended string being stored in said character tables by storing said previously received compressed code in the character table corresponding to said first character of said recovered string at the character table location corresponding to the string code assigned to said extended string.

2. The decompression method of claim 1 wherein said accessing step comprises using said currently received compressed code to select a character table, accessing a location corresponding to said currently received compressed code in the selected character table to recover the prefix code stored at the location, and further accessing locations corresponding to respective recovered prefix codes in character tables selected in accordance with the recovered prefix codes until said string corresponding to said currently received compressed code has been recovered, the characters of said recovered string corresponding to the selected character tables.

3. The decompression method of claim 2 wherein said further accessing step comprises further accessing said locations corresponding to said respective recovered prefix codes in said character tables selected in accordance with said recovered prefix codes until a recovered prefix code comprises a character value, the characters of said recovered string comprising a character having said character value and the characters corresponding to the selected character tables.

4. The decompression method of claim 2 including using a directory linking said string codes to respective character tables in which the strings corresponding to said string codes are stored.

5. The decompression method of claim 4 wherein said further accessing step includes accessing said directory with said recovered prefix codes to select character tables linked thereto.

6. The decompression method of claim 2 further including creating character tables and character table locations when required to store extended strings.

7. The decompression method of claim 4 further including creating character tables and character table locations when required to store extended strings, and creating a location in said directory for linking a string code assigned to a stored extended string to the character table in which said extended string is stored.

8. The decompression method of claim 2 in which a character table location includes a character table indication identifying the character table in which the prefix code stored at the location is included as a string code and wherein said further accessing step includes accessing said locations corresponding to said respective recovered prefix codes in character tables selected using the character table indications.

9. Data decompression apparatus for decompressing an input stream of compressed codes to recover an output stream of data characters corresponding thereto, said data characters being from an alphabet of data characters, comprising a plurality of character tables storing strings of data characters, said character tables corresponding to respective characters of said alphabet, said stored strings having respective string codes associated therewith, a string comprising a prefix string of at least one of said characters followed by an extension character, a particular string being stored in said character tables by storing the code associated with the prefix string of said particular string in the character table corresponding to the extension character of said particular string at a character table location corresponding to the string code of said particular string, means for accessing said character tables with a currently received compressed code so as to recover a string corresponding to said currently received compressed code from said character tables, thereby providing a recovered string, means for outputting the characters of said recovered string, thereby providing said output stream of data characters, and means for inserting into said character tables, an extended string comprising the string corresponding to the compressed code received previously to said currently received compressed code extended by the first character of said recovered string, said extended string being stored in said character tables by storing said previously received compressed code in the character table corresponding to said first character of said recovered string at the character table location corresponding to the string code assigned to said extended string.

10. The decompression apparatus of claim 9 wherein said accessing means comprises means for selecting a character table using said currently received compressed code, means for accessing a location corresponding to said currently received compressed code in the selected character table to recover the prefix code stored at the location, and means for further accessing locations corresponding to respective recovered prefix codes in character tables selected in accordance with the recovered prefix codes until said string corresponding to said currently received compressed code has been recovered, the characters of said recovered string corresponding to the selected character tables.

11. The decompression apparatus of claim 10 wherein said further accessing means comprises means for further accessing said locations corresponding to said respective recovered prefix codes in said character tables selected in accordance with said recovered prefix codes until a recovered prefix code comprises a character value, the characters of said recovered string comprising a character having said character value and the characters corresponding to the selected character tables.

12. The decompression apparatus of claim 10 including a directory linking said string codes to respective character tables in which the strings corresponding to said string codes are stored.

13. The decompression apparatus of claim 12 wherein said further accessing means includes means for accessing said directory with said recovered prefix codes to select character tables linked thereto.

14. The decompression apparatus of claim 10 further including means for creating character tables and character table locations when required to store extended strings.

15. The decompression apparatus of claim 12 further including means for creating character tables and character table locations when required to store extended strings, and means for creating a location in said directory for linking a string code assigned to a stored extended string to the character table in which said extended string is stored.

16. The decompression apparatus of claim 10 in which a character table location includes a character table indication identifying the character table in which the prefix code stored at the location is included as a string code and wherein said further accessing means includes means for accessing said locations corresponding to said respective recovered prefix codes in character tables selected using the character table indications.

* * * * *